United States Patent
Kim

(10) Patent No.: US 7,235,449 B2
(45) Date of Patent: Jun. 26, 2007

(54) METHOD OF FORMING A GATE OXIDE FILM FOR A HIGH VOLTAGE REGION OF A FLASH MEMORY DEVICE

(75) Inventor: Eun Soo Kim, Incheon-Si (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/167,961

(22) Filed: Jun. 28, 2005

(65) Prior Publication Data

US 2006/0258106 A1    Nov. 16, 2006

(30) Foreign Application Priority Data

May 11, 2005   (KR) .................... 10-2005-0039443

(51) Int. Cl.
    *H01L 21/336* (2006.01)
(52) U.S. Cl. .............. 438/287; 438/197; 438/257; 438/258; 257/E21.278; 257/E21.679
(58) Field of Classification Search .............. None
    See application file for complete search history.

(56) References Cited

U.S. PATENT DOCUMENTS 4,180,596 A * 12/1979 Crowder et al. ............ 438/664
4,448,800 A * 5/1984 Ehara et al. ................ 438/639
2005/0287729 A1* 12/2005 Steimle ...................... 438/197

FOREIGN PATENT DOCUMENTS

KR     0025449     3/1988

OTHER PUBLICATIONS

Official action issued in corresponding Korean application No. 2005-39443 dated Jun. 29, 2006.

* cited by examiner

*Primary Examiner*—Michael Lebentritt
*Assistant Examiner*—Kyoung Lee
(74) *Attorney, Agent, or Firm*—Marshall, Gerstein & Borun LLP

(57) ABSTRACT

A method of forming a gate oxide film for high voltage region of semiconductor devices includes forming patterns on a semiconductor substrate having a high voltage region, thereby exposing only a gate oxide film formation region for high voltage, forming a metal oxidization layer on the entire surface, and performing a process of removing the patterns, thereby forming the metal oxidization layer only in the gate oxide film formation region for high voltage.

6 Claims, 1 Drawing Sheet

METHOD OF FORMING A GATE OXIDE FILM FOR A HIGH VOLTAGE REGION OF A FLASH MEMORY DEVICE

BACKGROUND

1. Technical Field

A method of forming a gate oxide film for high voltage region of a flash memory device is disclosed.

2. Discussion of the Related Art

A flash memory device includes a cell region having a cell transistor for storing and erasing data by way of tunneling, and a peripheral circuit unit for driving the cell transistor. The peripheral circuit unit is divided into a low voltage region having a low voltage transistor for applying a low voltage, a high voltage region having a high voltage transistor having resistance against a high voltage of about 20V, which is necessary for tunneling, and the like.

A gate oxide film for high voltage and a gate oxide film for low voltage of a predetermined thickness are formed in each of the regions. When forming the gate oxide film for high voltage, which is thicker than the gate oxide film for low voltage, there is a problem in that a "bird's beak phenomenon" is easily generated.

SUMMARY OF THE DISCLOSURE

Accordingly, in view of the above problems, a method of forming a gate oxide film for a high voltage region in semiconductor devices is disclosed wherein the thicknesses of the gate oxide films in both the high and low voltage regions are about equal, thereby avoiding a bird's beak phenomenon, which is generated when forming a gate oxide film for a high voltage region which is thicker than a gate oxide film for a low voltage region.

A disclosed method of forming a gate oxide film for a high voltage region comprises forming patterns on a semiconductor substrate having a high voltage region, thereby exposing only a gate oxide film formation region for the high voltage region, forming a metal oxidization layer on the entire surface, and performing a process of removing the patterns, thereby forming the metal oxidization layer only on the gate oxide film formation region for the high voltage region.

The metal oxidization layer is preferably an aluminum oxide ($Al_2O_3$) layer.

The process of removing the patterns also removes the metal oxidization layer formed on the patterns, whereby the metal oxidization layer is formed only on the gate oxide film for the high voltage region.

DETAILED DESCRIPTION OF THE PRESENTLY PREFERRED EMBODIMENTS

Figure 1:
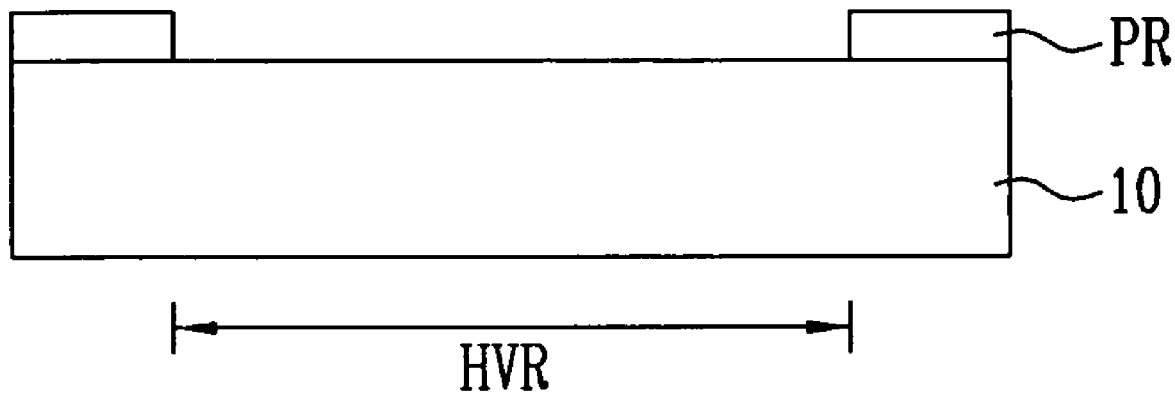
FIGS. 1 and 2 are cross-sectional views for explaining a disclosed method of forming a gate oxide film for a high voltage region of a semiconductor device.

Where it is described below that one film is disposed "on" an other film or a semiconductor substrate, the one film may directly contact the other film or the semiconductor substrate. Or, one or more other films may be disposed between the one film and the other film or the semiconductor substrate. Furthermore, in the drawing, the thickness and size of each layer are not to scale and may be exaggerated for convenience of explanation and clarity. Like reference numerals are used to identify the same or similar parts.

Disclosed herein is a transistor for a high voltage region in a flash memory device. The transistor has a structure of a MISFET (Metal Insulator Semiconductor Field Effect Transistor). A gate oxide film of the transistor can be formed of an aluminum oxide ($Al_2O_3$).

Figure 2:
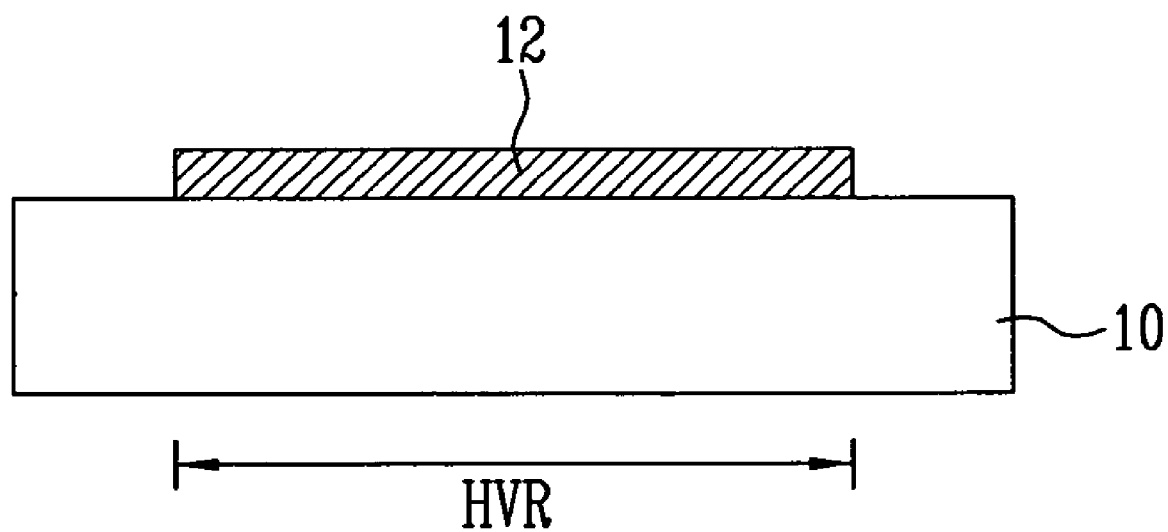

FIGS. 1 and 2 are cross-sectional views for explaining a disclosed method of forming a gate oxide film for a high voltage region in a semiconductor device.

Referring to FIG. 1, photoresist patterns PR through which a gate oxide film formation region for high voltage of a high voltage region HVR is exposed is formed on a semiconductor substrate 10 in which the high voltage region HVR, a low voltage region (not shown) and a cell region (not shown) are defined, and a transistor suitable for each region is selectively formed. The photoresist patterns PR are defined so that a region in which only a gate oxide film for a high voltage will be formed is exposed.

Referring to FIG. 2, an aluminum oxide ($Al_2O_3$) layer 12 is formed on the entire surface in which the photoresist patterns PR are formed.

The aluminum oxidization layer 12 is formed through the following steps: an aluminum source supply step; a first purification step; an oxygen reaction gas supply step; and a second purification step, wherein the four steps forms one cycle. In the aluminum source supply step, TMA and NH3 reaction gas being an aluminum source are supplied into a reactor at the same time for a period ranging from about 0.1 to about 3 seconds, so that an aluminum (Al) layer is adsorbed on a surface of a semiconductor substrate. The $NH_3$ reaction gas can be supplied at the flow rate ranging from about 10 to about 100 sccm.

In the first purification step, in order to remove an un-reacted aluminum source gas and reaction byproducts, a $N_2$ gas can be injected or vacuum-purified for a time period ranging from about 0.1 to about 3 seconds, and is then discharged through a discharge pump.

In the oxygen reaction gas supply step, an oxygen reaction gas is supplied into the reactor for a time period ranging from about 0.1 to about 3 seconds so that oxygen is adsorbed on the surface of the semiconductor substrate.

In the second purification step, in order to purge un-reacted oxygen reaction gas and reaction byproducts, a $N_2$ gas can be injected or vacuum-purified for a time period ranging from about 0.1 to about 3 seconds, and is then discharged through a discharge pump.

In order to form the aluminum oxide film to a desired thickness, the four steps are repeatedly performed until a desired thickness is formed with the four steps being one cycle.

At this time, the aluminum oxidization layer 12 is formed on the photoresist patterns PR as well as the exposed gate oxide film formation region for high voltage.

Thereafter, a process of removing the photoresist patterns PR from the result in which the aluminum oxidization layer 12 is formed is performed, thereby completing the present process.

At this time, in the process of removing the photoresist patterns, the aluminum oxidization layer 12 formed on the photoresist patterns is also removed, whereby the aluminum oxidization layer 12 remains only in the gate oxide film formation region for the high voltage region HVR. The aluminum oxidization layer 12 formed as such is used as a gate oxide film for a transistor or flash memory.

Though not shown in the drawings, a process of forming a gate electrode for the high voltage region on the entire surface in which the gate oxide film for the high voltage region is formed is performed.

As described above, a gate oxide film for a high voltage region is formed only in a region in which an aluminum oxidization layer will be defined through photoresist patterns. Accordingly, a bird's beak phenomenon, which is generated when forming a gate oxide film for a high voltage region, which is thicker than a gate oxide film for a low voltage region, can be prevented. As such, since a bird's beak phenomenon, which is generated in a gate oxide film formation process for high voltage, is prevented, there are effects in that a gate oxide film formation area for high voltage can be minimized and a gate electrode topology can be minimized.

Although the foregoing description has been made with reference to the preferred embodiments, it is to be understood that changes and modifications may be made by the ordinary skilled in the art without departing from the spirit and scope of this disclosure and the appended claims.

What is claimed is:

1. A method of forming a gate oxide film for a high voltage region of a semiconductor device, comprising:

forming patterns on a semiconductor substrate having a high voltage region, thereby exposing only a gate oxide film formation region for the high voltage region;

forming an aluminum oxide ($Al_2O_3$) metal oxidization layer on the entire surface including the patterns, wherein the aluminum oxide metal oxidization layer is formed through the following steps (a) to (d):

(a) supplying an aluminum source;
(b) carrying out a first purification step;
(c) supplying an oxygen reaction gas to form an $Al_2O_3$ reaction product; and,
(d) purifying the $Al_2O_3$ reaction product in a second purification step, wherein steps (a)–(d) form one cycle, and performing a process of removing the patterns, thereby leaving the aluminum oxide metal oxidization layer only in the gate oxide film formation region for the high voltage region.

2. The method as claimed in claim 1, wherein the process of removing the patterns also removes the aluminum oxide metal oxidization layer formed on top of the patterns, whereby the aluminum oxide metal oxidization layer remains only in the gate oxide film formation region for the high voltage region.

3. The method as claimed in claim 1, wherein step (a) comprises supplying trimethylaluminum (TMA) and ammonia ($NH_3$) reaction gas into a reactor together for a time period ranging from about 0.1 second to about 3 seconds, so that an aluminum (Al) layer is adsorbed on a surface of the semiconductor substrate.

4. The method as claimed in claim 1, wherein step (b) comprises injecting nitrogen ($N_2$) gas or vacuum-purifying for a time period ranging from about 0.1 second to about 3 seconds in order to remove unreacted aluminum and reaction byproducts, and then discharging said unreacted aluminum and reaction by products through a discharge pump.

5. The method as claimed in claim 1, wherein step (c) comprises supplying the oxygen reaction gas into a reactor for a time period ranging from about 0.1 second to about 3 seconds so that oxygen is adsorbed on the surface of the semiconductor substrate.

6. The method as claimed in claim 1, wherein step (d) comprises injecting nitrogen ($N_2$) gas or vacuum-purifying for a time period ranging from about 0.1 second to about 3 seconds in order to purge unreacted oxygen reaction gas and reaction byproducts, and is then discharging said unreacted oxygen reaction gas and reaction byproducts through a discharge pump.

* * * * *